United States Patent
Qi et al.

(10) Patent No.: US 10,822,715 B2
(45) Date of Patent: Nov. 3, 2020

(54) METHOD FOR LIMITING GROWTH OF KDP-TYPE CRYSTALS WITH A LONG SEED

(71) Applicant: Shanghai Institue of Optics And Fine Mechanics, Chinese Academy of Sciences, Shanghai (CN)

(72) Inventors: Hongji Qi, Shanghai (CN); Duanyang Chen, Shanghai (CN); Jianda Shao, Shanghai (CN); Xiaoyi Xie, Shanghai (CN); Bin Wang, Shanghai (CN); Hu Wang, Shanghai (CN)

(73) Assignee: Shanghai Institute of Optics And Fine Mechanics, Chinese Academy of Sciences, Shanghai (CN)

( * ) Notice: Subject to any disclaimer, the term of this patent is extended or adjusted under 35 U.S.C. 154(b) by 106 days.

(21) Appl. No.: 16/218,291

(22) Filed: Dec. 12, 2018

(65) Prior Publication Data
US 2019/0136403 A1   May 9, 2019

(30) Foreign Application Priority Data
Oct. 21, 2017  (CN) .......................... 2017 1 0987729

(51) Int. Cl.
| | |
|---|---|
| C30B 7/08 | (2006.01) |
| C30B 29/60 | (2006.01) |
| C30B 29/14 | (2006.01) |
| C30B 29/64 | (2006.01) |

(52) U.S. Cl.
CPC ................ C30B 7/08 (2013.01); C30B 29/14 (2013.01); C30B 29/60 (2013.01); C30B 29/64 (2013.01)

(58) Field of Classification Search
CPC .............. C30B 29/22; C30B 7/08; C30B 7/00
See application file for complete search history.

(56) References Cited

U.S. PATENT DOCUMENTS

| | | | | |
|---|---|---|---|---|
| 4,670,117 A | * | 6/1987 | Yoshida ................. | B01D 61/00 204/523 |
| 2004/0011278 A1 | * | 1/2004 | Tatartchenko .......... | C30B 29/14 117/1 |

FOREIGN PATENT DOCUMENTS

| | | |
|---|---|---|
| CN | 2326617 Y | 6/1999 |
| CN | 103361712 A | 10/2013 |

* cited by examiner

*Primary Examiner* — Robert M Kunemund
(74) *Attorney, Agent, or Firm* — Mei & Mark LLP; Manni Li

(57) ABSTRACT

Method for limiting growth of KDP-type crystals with a long seed where an upper and a lower ends of the long seed crystal are respectively limited by an upper baffle plate and a lower tray to restrain growth of a pyramidal surface and allow only four prismatic surfaces in [100] and [010] directions to grow. Finally grown crystal contains no pyramid-prism interface that severely restricts quality of optical element, and all cut optical elements have high optical quality. As four prismatic surfaces are subjected to highly similar growing environment and grow simultaneously, all optical elements cut therefrom have high optical uniformity. Due to uniqueness of a cutting angle of a KDP crystal frequency-tripled element, high cutting efficiency is achieved in the element, and an area of a maximum frequency-tripled element that may be cut is known in advance according to a horizontal size of the grown crystal.

6 Claims, 3 Drawing Sheets

METHOD FOR LIMITING GROWTH OF KDP-TYPE CRYSTALS WITH A LONG SEED

CROSS-REFERENCE TO RELATED APPLICATION

The subject application claims priority on Chinese patent application CN201710987729.6 filed on Oct. 21, 2017 in China. The contents and subject matter of the Chinese priority application is incorporated herein by reference.

TECHNICAL FIELD

The present invention relates to KDP-type crystals, and particularly, to a method for limiting growth of KDP-type crystals with a long seed and to rapidly grow the KDP-type crystals with no pyramid-prism interface.

BACKGROUND ART

Currently, inertial confinement fusion (ICF) devices used in various countries need a large quantity of high-quality and large-caliber KDP-type crystals (including Potassium Dihydrogen Phosphate, known as KDP crystal ($KH_2PO_4$) and its isomorphic crystals, deuterated KDP, known as KD*P or DKDP crystal ($KD_2PO_4$)). The KDP crystal is used as an optical switch and a frequency-doubled element, and the DKDP crystal is used as a frequency-tripled element. The KDP crystal is mainly grown by a slow growth method and a rapid growth method with a point seed.

In the slow growth method, a sheet-shaped seed crystal grows in the [001] direction in a growth solution having a low degree of supersaturation, and does not grow in the [100] direction, and all finally grown crystals are pyramids growing from the pyramidal surfaces. However, the growth speed is slow, resulting in a relatively long growth cycle.

In the rapid point seed crystal growth method, a point seed crystal grows in the [100] and [001] directions in a growth solution having a high degree of supersaturation, and a finally obtained crystal contains a prism growing from a prismatic surface and a pyramid growing from a pyramidal surface, so that a boundary between the pyramid and the pyramidal inside the crystal forms a pyramid-prism interface, which is the part of the crystal that has poor quality and becomes a defect restricting the overall quality of the crystal.

Chinese Patent Application Publication CN103361712A discloses a crystal-carrying rack for growing a KDP crystal with large cross-section and a growth method thereof. The Chinese publication discloses that a seed crystal is fixed in the center of the surface of an upper or a lower transverse plate. When a crystal grows to a position 1 mm to 5 mm away from the other transverse plate, the degree of supersaturation of the solution is reduced until the crystal grows to be in contact with that transverse plate. Although a DKDP crystal with large cross-section in a particular direction may be grown finally, in an early growth stage, the crystal grows comprehensively, that is, both the pyramidal faces and the prismatic faces of the crystal grow simultaneously, and a pyramid-prism interface inevitably exists inside the crystal, which severely restricts the quality of the frequency-tripled element cut therefrom.

Chinese Utility Patent Publication CN2326617Y discloses a crystal-carrying rack for rapidly growing a potassium dihydrogen phosphate crystal with large cross-section. In the utility patent document, a seed crystal is fixed on the left or right side plate, and the seed crystal is cut under a laser wavelength of 1.06 μm based on the Category II cutting and processing. As a result, a pyramid-prism interface caused by simultaneous growth of the pyramidal faces and the prismatic faces inevitably exists in the growth process, which severely restricts the quality of the frequency-tripled element cut therefrom.

SUMMARY OF THE INVENTION

To overcome the problems in the KDP-type crystals growth process, the present invention provides a method for limiting growth of KDP-type crystals with a long seed. The method of the present invention helps to rapidly grow KDP-type crystals containing no pyramid-prism interface, and in a growth process, all growing surfaces are prismatic surfaces and subject to highly similar growth environments. Therefore, all optical elements cut from the crystal of the present invention have higher optical uniformity. The present invention achieves a particularly high cutting efficiency when a frequency-tripled element is cut.

The present invention provides a method for limiting growth of KDP-type crystals with a long seed. The method includes the following steps:

(1) preparing a growth vessel for growing a crystal, where a motor is mounted on an upper part of the growth vessel, and a lower end of a rotor of the motor is connected to a rotating shaft of a crystal-carrying rack;

(2) preparing the crystal-carrying rack for growing the crystal, where the crystal-carrying rack includes a lower tray, an upper baffle plate having an area that is the same size as the area of the lower tray, at least two side bars connecting the lower tray and the upper baffle plate, and the rotating shaft whose bottom part is fixed to the center of the upper baffle plate;

(3) preparing a long seed crystal whose height direction is a [001] direction, where the height of the long seed crystal is equal to the distance between the lower tray and the upper baffle plate of the crystal-carrying rack, and a horizontal length and a width of the long seed crystal range from 5 to 15 mm;

(4) dispensing AB glue on the upper and lower end surfaces of the long seed crystal, and mounting the long seed crystal to the centers of the lower tray and the upper baffle plate of the crystal-carrying rack;

(5) preparing a crystal growth solution with a saturation point at 45° C. to 85° C.;

(6) placing the crystal-carrying rack mounted with the long seed crystal into an oven for preheating for 5 to 10 hours, where a preheating temperature is the saturation point temperature of the growth solution;

(7) after preheating being completed, placing the crystal-carrying rack mounted with the long seed crystal into the prepared growth solution, connecting the rotating shaft of the crystal-carrying rack to the rotor of the motor, starting the motor, and setting a range of a rotational speed to 20 rpm to 50 rpm, where a rotating mode uses a cycle of forward rotating for 25 seconds, then decelerating for 2 seconds, then stopping for 1 second, then backward accelerating for 2 seconds, then backward rotating for 25 seconds, then decelerating for 2 seconds, then stopping for 1 second, and then forward accelerating for 2 seconds; and (8) heating the growth solution to 2° C. to 10° C. above the saturation point temperature for overheating processing, so that all four side surfaces of the long seed crystal are dissolved but the long seed crystal is not broken; then performing cooling, so that a degree of supersaturation of the growth solution remains between 5 to 15%, and then a crystal starts to grow on the long seed crystal, to obtain a crystal containing no pyramid-prism interface.

Technical advantages of the present invention are as follows:

In the method for limiting growth of KDP-type crystals with a long seed in the present invention, an upper end and a lower end of the long seed crystal in the growth solution are respectively limited by the upper baffle plate and the lower tray, so that growth of a pyramidal surface is restrained, and only four prismatic surfaces in [100] and [010] directions may grow. A finally grown crystal is cuboid-shaped, has a square-shaped horizontal section, and does not contain a pyramid-prism interface, and all cut optical elements have very high optical quality. In the growing process, all growing surfaces are prismatic surfaces and subject to highly similar growth environments, so that all cut optical elements have higher optical uniformity. It should be particularly noted that when a frequency-tripled element is cut, first, the crystal is vertically divided into two parts from the center of a surface along [100]. Because a horizontal size of the long seed crystal generally may be ignored compared with the horizontal size of the grown crystal, each of the two parts obtained by dividing the grown crystal is a rectangle whose horizontal section has a length-width ratio of 2:1. In addition, because when the KDP crystal is cut into a frequency-tripled element, a matching angle is about 60°, and an azimuth is 00 or 90°, each of the two parts obtained by dividing the grown crystal may be exactly cut into an approximately square-shaped frequency-tripled element in the [100] direction and at an angle of about 30° in the [001] direction, so that a high cutting efficiency is achieved. Moreover, the approximately square-shaped frequency-tripled element that is cut has a size that is exactly approximately equal to a size of a horizontal section of the grown crystal, so that an area of a maximum frequency-tripled element that may be cut is known in advance according to the horizontal size of the grown crystal.

Figure 1:
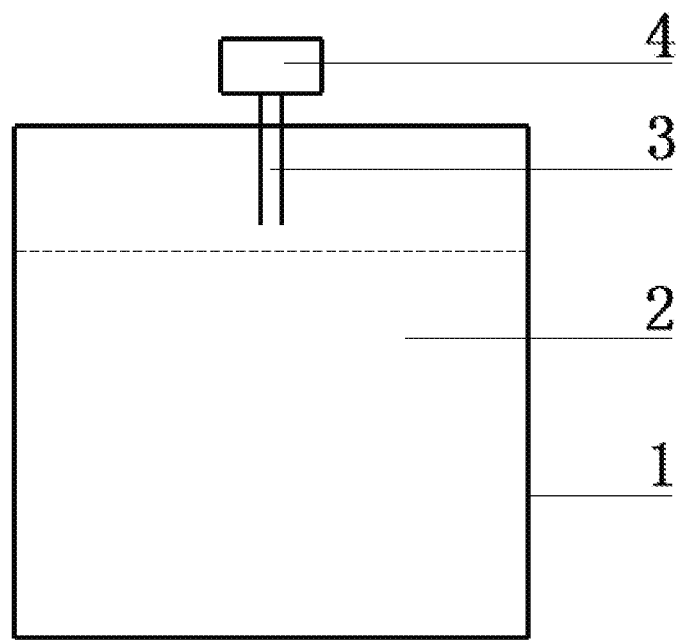
FIG. 1 is a schematic diagram showing one embodiment of the growth trench used in the method for limiting growth of KDP-type crystals with a long seed of the present invention.
Figure 2:
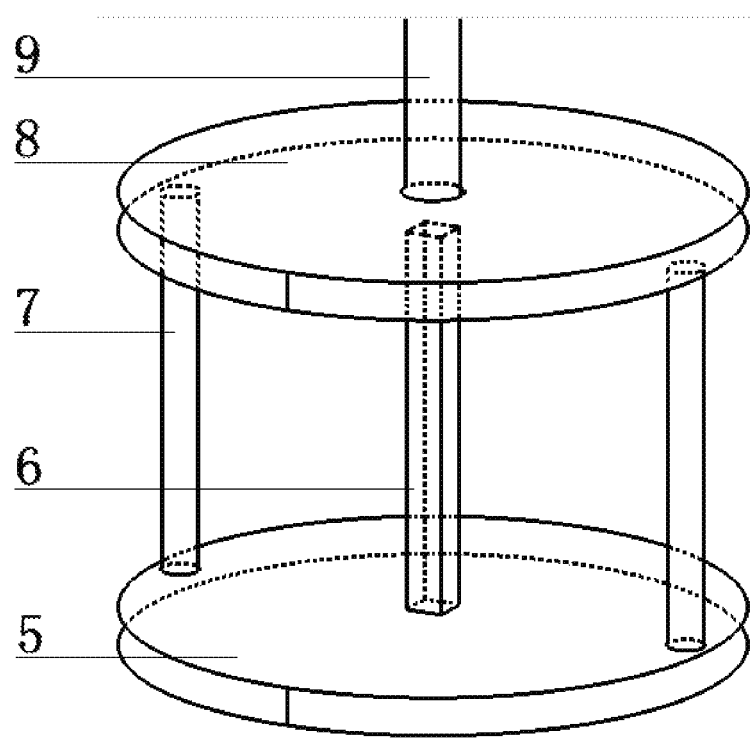
FIG. 2 is a schematic diagram showing one embodiment of the crystal-carrying rack used in the method for limiting growth of KDP-type crystals with a long seed of the present invention.

Reference numbers used in the drawings are referring to the following elements: 1—Growth trench; 2—Growth solution; 3—Motor rotor; 4—Motor; 5—Lower tray; 6—Long seed crystal; 7—Side bar; 8—Upper baffle plate; 9—Rotating shaft; 10—Grown crystal; and 11—Frequency-tripled element.

DETAILED DESCRIPTION OF THE INVENTION

The present invention is further described in details below with reference to the accompanying drawings and examples, but it should not be used to limit the protection scope of the present invention.

Example 1. Limited Growth of KDP Crystals with a Long Seed

The limited growth of KDP crystals with a long seed is achieved as follows. Referring to FIGS. 1 to 4, the method for limiting growth of KDP crystals with a long seed of the present invention includes the following steps:

(1) manufacturing a growth trench 1 used for growing a crystal, where a motor 4 is mounted on an upper part of the growth trench 1, and a lower end of a rotor 3 of the motor 4 is connected to a rotating shaft 9 of a crystal-carrying rack;

(2) manufacturing the crystal-carrying rack used for growing the crystal, where the crystal-carrying rack includes a lower tray 5, an upper baffle plate 8 having an area the same as an area of the lower tray 5, at least two side bars 7 connecting the lower tray 5 and the upper baffle plate 8, and the rotating shaft 9 whose bottom part is fixed to the center of the upper baffle plate 8;

(3) manufacturing a KDP long seed crystal 6 whose height direction is a [001] direction, where a height of the KDP long seed crystal 6 is equal to a distance between the lower tray 5 and an upper baffle plate 8 of the crystal-carrying rack, and a horizontal length and a width of the KDP long seed crystal 6 are 5 mm;

(4) dispensing AB glue on upper and lower end surfaces of the KDP long seed crystal 6, and mounting the KDP long seed crystal to the centers of the lower tray 5 and the upper baffle plate 8 of the crystal-carrying rack;

(5) preparing a KDP crystal growth solution 2 with a saturation point at 45° C.;

(6) placing the crystal-carrying rack mounted with the KDP long seed crystal 6 into an oven for preheating for 7 hours, where a preheating temperature is 45° C.;

(7) after preheating being completed, placing the crystal-carrying rack mounted with the KDP long seed crystal into the prepared KDP growth solution 2, connecting the rotating shaft 9 of the crystal-carrying rack to the rotor 3 of the motor, starting the motor 4, and setting a rotational speed to 30 rpm, where a rotating mode uses a cycle of forward rotating for 25 s, then decelerating for 2 s, then stopping for is, then backward accelerating for 2 s, then backward rotating for 25 s, then decelerating for 2 s, then stopping for 1 s, and then forward accelerating for 2 s, wherein s refers to second; and (8) heating the KDP growth solution 2 to 55C for overheating processing, so that all four side surfaces of the KDP long seed crystal 6 are dissolved but the KDP long seed crystal 6 is not broken; then performing cooling, so that a degree of supersaturation of the KDP growth solution 2 remains in 15%, and then a KDP crystal starts to grow on the KDP long seed crystal 6, to obtain a KDP crystal 10 containing no pyramid-prism interface.

Figure 3:
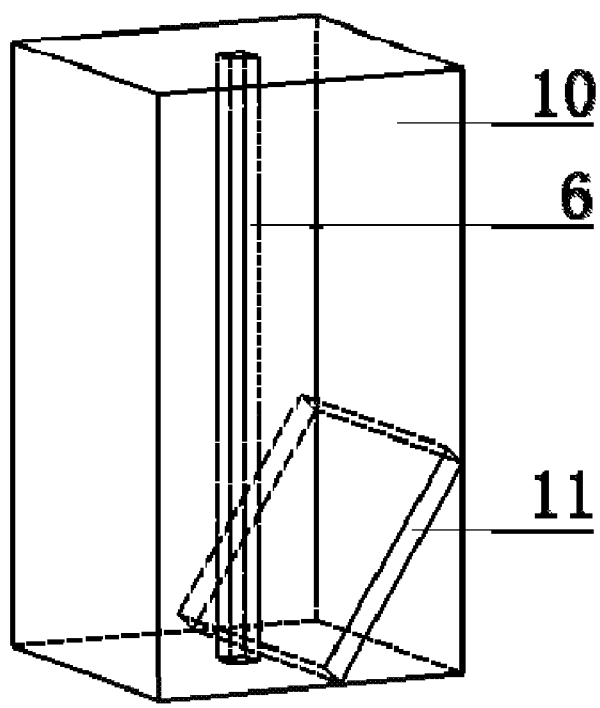
FIG. 3 is a schematic diagram showing that one frequency-tripled element is cut from the crystal grown using the method for limiting growth of KDP-type crystals with a long seed of the present invention.
Figure 4:
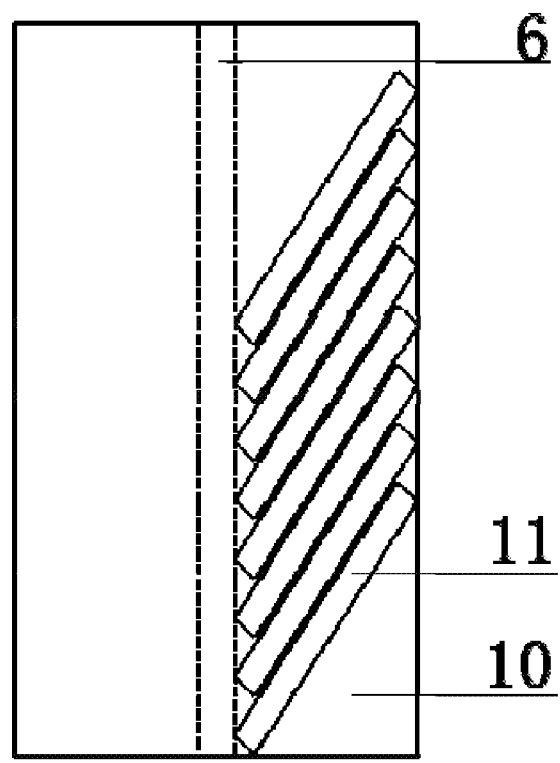
FIG. 4 is a schematic diagram showing that multiple frequency-tripled elements are cut from the crystal grown using the method for limiting growth of KDP-type crystals with a long seed of the present invention.

As shown in FIGS. 3 and 4, respectively, the crystal grown using the method of the present invention may be cut into one frequency-tripled element or multiple frequency-tripled elements. Particularly, when a frequency-tripled element 11 is cut, a matching angle of the KDP crystal is 59°6', and an azimuth is 0° or 90°, so that each of two parts obtained by dividing the grown KDP crystal 10 may be exactly cut into an approximately square-shaped frequency-tripled element 11 in the [100] direction at an angle of 30°54' in the [001] direction, and cutting efficiency is very high. In addition, a size of the approximately square-shaped frequency-tripled element that is cut is exactly approximately equal to a size of a horizontal section of the grown KDP crystal 10.

Example 2. Limited Growth of DKDP Crystals of 30% Deuteration Rate with a Long Seed In the present invention, limited growth of DKDP crystals of 30% deuteration rate with a long seed is achieved. Referring to FIGS. 1 to 4, the method for limiting growth of DKDP crystals of 30% deuteration rate with a long seed includes the following steps:

(1) manufacturing a growth trench 1 used for growing a crystal, where a motor 4 is mounted on an upper part of the growth trench 1, and a lower end of a rotor 3 of the motor 4 is connected to a rotating shaft 9 of a crystal-carrying rack;

(2) manufacturing the crystal-carrying rack used for growing the crystal, where the crystal-carrying rack includes a lower tray 5, an upper baffle plate 8 having an area the same as an area of the lower tray 5, at least two side bars 7 connecting the lower tray 5 and the upper baffle plate 8, and the rotating shaft 9 whose bottom part is fixed to the center of the upper baffle plate 8;

(3) manufacturing a DKDP long seed crystal 6 that has the deuteration rate of 30% and whose height direction is a [001] direction, where a height of the DKDP long seed crystal 6 with the deuteration rate of 30% is equal to a distance between the lower tray 5 and an upper baffle plate 8 of the crystal-carrying rack, and a horizontal length and a width of the DKDP long seed crystal 6 with the deuteration rate of 30% are 10 mm;

(4) dispensing AB glue on upper and lower end surfaces of the DKDP long seed crystal 6 with the deuteration rate of 30%, and mounting the DKDP long seed crystal to the centers of the lower tray 5 and the upper baffle plate 8 of the crystal-carrying rack;

(5) preparing a DKDP crystal growth solution 2 with a saturation point at 65° C. and with a deuteration rate that can grow DKDP crystal of 30% deuteriation rate;

(6) placing the crystal-carrying rack mounted with the DKDP long seed crystal 6 with the deuteration rate of 30% into an oven for preheating for 10 hours, where a preheating temperature is 65° C.;

(7) after preheating being completed, placing the crystal-carrying rack mounted with the DKDP long seed crystal with the deuteration rate of 30% into the prepared DKDP growth solution 2 with a deuteration rate that can grow DKDP crystal of 30% deuteriation rate, connecting the rotating shaft 9 of the crystal-carrying rack to the rotor 3 of the motor, starting the motor 4, and setting a rotational speed to 50 rpm, where a rotating mode uses a cycle of forward rotating for 25 s, then decelerating for 2 s, then stopping for 1 s, then backward accelerating for 2 s, then backward rotating for 25 s, then decelerating for 2 s, then stopping for is, and then forward accelerating for 2 s, wherein s refers to second; and (8) heating the DKDP growth solution 2 with the deuteration rate of 30% to 70° C. for overheating processing, so that all four side surfaces of the DKDP long seed crystal 6 with the deuteration rate of 30% are dissolved but the DKDP long seed crystal 6 with the deuteration rate of 30% is not broken; then performing cooling, so that a degree of supersaturation of the DKDP growth solution 2 with a deuteration rate that can grow DKDP crystal of 30% deuteriation rate remains in 5%, and then a DKDP crystal with the deuteration rate of 30% starts to grow on the DKDP long seed crystal 6 with the deuteration rate of 30%, to obtain a DKDP crystal 10 with the deuteration rate of 30% and containing no pyramid-prism interface.

As shown in FIGS. 3 and 4, respectively, the crystal grown using the method of the present invention may be cut into one frequency-tripled element or multiple frequency-tripled elements. Particularly, when a frequency-tripled element 11 is cut, a matching angle of the DKDP crystal with the deuteration rate of 30% is 59°30', and an azimuth is 0° or 90°, so that each of two parts obtained by dividing the grown crystal 10 may be exactly cut into an approximately square-shaped frequency-tripled element 11 in the [100] direction at an angle of 30°30' in the [001] direction, and cutting efficiency is very high. In addition, a size of the approximately square-shaped frequency-tripled element that is cut is exactly approximately equal to a size of a horizontal section of the grown DKDP crystal 10 with the deuteration rate of 30%.

Example 3. Limited Growth of DKDP Crystals of 70% Deuteration Rate with a Long Seed In the present invention, limited growth of DKDP crystals of 70% deuteration rate with a long seed is achieved. Referring to FIGS. 1 to 4, the method for limiting growth of DKDP crystals of 70% deuteration rate with a long seed includes the following steps of:

(1) manufacturing a growth trench 1 used for growing a crystal, where a motor 4 is mounted on an upper part of the growth trench 1, and a lower end of a rotor 3 of the motor 4 is connected to a rotating shaft 9 of a crystal-carrying rack;

(2) manufacturing the crystal-carrying rack used for growing the crystal, where the crystal-carrying rack includes a lower tray 5, an upper baffle plate 8 having an area the same as an area of the lower tray 5, at least two side bars 7 connecting the lower tray 5 and the upper baffle plate 8, and the rotating shaft 9 whose bottom part is fixed to the center of the upper baffle plate 8;

(3) manufacturing a DKDP long seed crystal 6 that has the deuteration rate of 70% and whose height direction is a [001] direction, where a height of the DKDP long seed crystal 6 with the deuteration rate of 70% is equal to a distance between the lower tray 5 and an upper baffle plate 8 of the crystal-carrying rack, and a horizontal length and a width of the DKDP long seed crystal 6 with the deuteration rate of 70% are 15 mm;

(4) dispensing AB glue on upper and lower end surfaces of the DKDP long seed crystal 6 with the deuteration rate of 70%, and mounting the DKDP long seed crystal to the centers of the lower tray 5 and the upper baffle plate 8 of the crystal-carrying rack;

(5) preparing a DKDP crystal growth solution 2 with a saturation point at 85° C. and with a deuteration rate that can grow DKDP crystal of 70% deuteriation rate;

(6) placing the crystal-carrying rack mounted with the DKDP long seed crystal 6 with the deuteration rate of 70% into an oven for preheating for 5 hours, where a preheating temperature is 85° C.;

(7) after preheating being completed, placing the crystal-carrying rack mounted with the DKDP long seed crystal with the deuteration rate of 70% into the prepared DKDP growth solution 2 with a deuteration rate that can grow DKDP crystal of 70% deuteriation rate, connecting the rotating shaft 9 of the crystal-carrying rack to the rotor 3 of the motor, starting the motor 4, and setting a rotational speed to 20 rpm, where a rotating mode uses a cycle of forward rotating for 25 s, then decelerating for 2 s, then stopping for 1 s, then backward accelerating for 2 s, then backward rotating for 25 s, then decelerating for 2 s, then stopping for is, and then forward accelerating for 2 s, wherein s refers to second; and (8) heating the DKDP growth solution 2 with the deuteration rate of 70% to 87C for overheating processing, so that all four side surfaces of the DKDP long seed crystal 6 with the deuteration rate of 70% are dissolved but the DKDP long seed crystal 6 with the deuteration rate of 70% is not broken; then performing cooling, so that a degree of supersaturation of the DKDP growth solution 2 with a deuteration rate that can grow DKDP crystal of 70% deuteriation rate remains in 10%, and then a DKDP crystal with the deuteration rate of 70% starts to grow on the DKDP long seed crystal 6 with the deuteration rate of 70%, to obtain a DKDP crystal 10 with the deuteration rate of 70% and containing no pyramid-prism interface.

As shown in FIGS. 3 and 4, respectively, the crystal grown using the method of the present invention may be cut into one frequency-tripled element or multiple frequency-tripled elements. Particularly, when a frequency-tripled element 11 is cut, a matching angle of the DKDP crystal with the deuteration rate of 70% is 60°3', and an azimuth is 0° or 90°, so that each of two parts obtained by dividing the grown crystal 10 may be exactly cut into an approximately square-shaped frequency-tripled element 11 in the [100] direction at an angle of 29°57' in the [001] direction, and cutting efficiency is very high. In addition, a size of the approximately square-shaped frequency-tripled element that is cut is exactly approximately equal to a size of a horizontal section of the grown DKDP crystal 10 with the deuteration rate of 70%.

The example indicates that the crystal 10 that is rapidly grown by using the method for limiting growth of KDP-type crystals with a long seed in the present invention does not contain a pyramid-prism interface that severely restricts quality of an element, and all cut optical elements have very high optical quality. Because in a growing process, four prismatic surfaces having highly similar growing environments grow simultaneously, all cut optical elements have very high optical uniformity. Due to uniqueness of a cutting angle of the KDP crystal frequency-tripled element 11, a high cutting efficiency is achieved when the crystal 10 grown by using the present invention is cut into the frequency-tripled element 11, and an area of a maximum frequency-tripled element 11 that may be cut may be known in advance according to a horizontal size of the grown crystal 10.

We claim:

1. A method for limiting growth of KDP-type crystals with a long seed, comprising
preparing a growth trench for growing a crystal, the growth trench having an upper part that is mounted with a motor, and the motor having a rotor,
preparing a crystal-carrying rack for growing the crystal, the crystal-carrying rack comprising a lower tray, an upper baffle plate having an area in a same size as an area of the lower tray, at least two side bars connecting the lower tray and the upper baffle plate, and a rotating shaft having a bottom part being fixed to a center of the upper baffle plate, and the rotating shaft being connected to a lower end of the rotor of the motor,
preparing a long seed crystal having a height direction at a [001] direction and a height equal to a distance between the lower tray and the upper baffle plate of the crystal-carrying rack, and a horizontal length and a width of the long seed crystal range from 5 to 15 mm;
dispensing a two-component room temperature-curing epoxy resin glue on upper and lower end surfaces of the long seed crystal, and mounting the long seed crystal to centers of the lower tray and the upper tray of the crystal-carrying rack;
preparing a crystal growth solution with a saturation point at 45° C. to 85° C.;
placing the crystal-carrying rack mounted with the long seed crystal into an oven and preheating the crystal-carrying rack for 5 to 10 hours at a temperature that is the saturation point temperature of the crystal growth solution;
placing the preheated crystal-carrying rack mounted with the long seed crystal into the growth solution, connecting the rotating shaft of the crystal-carrying rack to the rotor of the motor, starting the motor, and setting a range of a rotational speed to 20 to 50 rpm and rotating in a rotating mode; and
overheating the growth solution to a temperature that is 2° C. to 10° C. above the saturation point temperature of the growth solution to dissolve all four side surfaces of the long seed crystal while maintaining that the long seed crystal is not broken, cooling the growth solution and maintaining the degree of supersaturation of the growth solution at between 5% to 15%, and growing a crystal on the long seed crystal to obtain a crystal with no pyramid-prism interface.

2. The method for limiting growth of KDP-type crystals with a long seed as described in claim 1, wherein the rotating mode uses a cycle of forward rotating for 25 seconds, then decelerating for 2 seconds, then stopping for 1 second, then backward accelerating for 2 seconds, then backward rotating for 25 seconds, then decelerating for 2 seconds, then stopping for 1 second, and then forward accelerating for 2 seconds.

3. The method for limiting growth of KDP-type crystals with a long seed as described in claim 1, wherein the long seed crystal is a long seed crystal of a KDP crystal.

4. The method for limiting growth of KDP-type crystals with a long seed as described in claim 1, wherein the long seed crystal is a long seed crystal of a DKDP crystal.

5. The method for limiting growth of KDP-type crystals with a long seed as described in claim 4, wherein the long seed crystal of the DKDP crystal has a deuteration rate of 30%.

6. The method for limiting growth of KDP-type crystals with a long seed as described in claim 4, wherein the long seed crystal of the DKDP crystal has a deuteration rate of 70%.

* * * * *